United States Patent
Cairns

(10) Patent No.: US 7,456,770 B2
(45) Date of Patent: Nov. 25, 2008

(54) DISTRIBUTED SIGMA-DELTA SENSOR NETWORK

(75) Inventor: Douglas A. Cairns, Durham, NC (US)

(73) Assignee: Telefonaktiebolaget I.M. Ericsson (publ) (SE)

(*) Notice: Subject to any disclaimer, the term of this patent is extended or adjusted under 35 U.S.C. 154(b) by 49 days.

(21) Appl. No.: 11/681,213

(22) Filed: Mar. 2, 2007

(65) Prior Publication Data

US 2008/0211704 A1    Sep. 4, 2008

(51) Int. Cl.
    *H03M 3/00* (2006.01)
(52) U.S. Cl. .................. 341/143; 341/155
(58) Field of Classification Search ............ 341/143, 341/155
    See application file for complete search history.

(56) References Cited

U.S. PATENT DOCUMENTS

| | | | |
|---|---|---|---|
| 5,396,246 A * | 3/1995 | Coquerel | 341/155 |
| 6,483,923 B1 * | 11/2002 | Marash | 381/92 |
| 7,196,652 B2 * | 3/2007 | Liu et al. | 341/172 |
| 7,424,403 B2 * | 9/2008 | Robinson et al. | 702/189 |

OTHER PUBLICATIONS

A. Chhetri, D. Morrell, A. Papandreou-Suppappola, "Sensor Scheduling Using a 0-1 Mixed Integer Programming Framework," *Fourth IEEE Workshop on Sensor Array and Multichannel Processing*, 2006, pp. 471-475.

P. Aziz, H. Sorensen, J. van der Spiegel, "An Overview of Sigma-Delta Converters," *IEEE Signal Processing Magazine*, Jan. 1996, pp. 61-84.

* cited by examiner

*Primary Examiner*—Khai M Nguyen
(74) *Attorney, Agent, or Firm*—Coates & Bennett, P.L.L.C.

(57) ABSTRACT

The sensor network described herein uses a distributed sigma-delta converter, where each of a plurality of sensor nodes includes a sigma-delta modulator communicatively coupled to a remotely located sigma-delta processor in a control hub. Each sensor node generates a serial bit stream representative of a sensor output signal. The control hub includes a plurality of signal processors, each of which receive and digitally process the serial bit stream wirelessly transmitted by a corresponding sensor node. A controller in the control hub analyzes the digital output from each signal processor to determine one or more characteristics of the sensor network.

20 Claims, 5 Drawing Sheets

DISTRIBUTED SIGMA-DELTA SENSOR NETWORK

TECHNICAL FIELD

The present invention relates generally to sensor networks, and more particularly to distributed sensor networks.

BACKGROUND

Wireless sensor networks provide efficient and far reaching means for monitoring various environmental conditions, including sound, temperature, motion, etc. While wireless sensor networks were originally developed for military applications, such networks also have a wide range of commercial applications. Thus, there is significant interest in improving the efficiency and/or accuracy of sensor networks.

One exemplary sensor network used for tracking targets is described in "Sensory Scheduling Using a 0-1 Mixed Integer Programming Framework" by A. Chhetri, D. Morrell, and A. Papandreou-Suppappola. This sensor network includes a plurality of sensor nodes that wirelessly communicate with a central hub. The individual sensor nodes measure acoustic energy and make hard decisions regarding the presence (or lack thereof) of a target. Each sensor node reports its decision to the central control hub with a single bit. The hub aggregates the decisions received from each sensor node to determine the target's location. The hub may also implement a scheduling algorithm that schedules when each sensor node should be active. In so doing, the hub increases the battery life of the sensors.

By reporting the decision to the central hub, the sensor nodes significantly simplify the signals communicated to the central hub, which in turn reduces the power requirements for each sensor node. While reporting the hard decision to the hub helps conserve the sensor nodes' battery power, the reported decisions often limit the ability of the central hub to fully evaluate a sensed condition. For example, while the reported hard decisions may enable the central hub to detect a target, the hard decisions may not enable the central hub to track a target or determine a characteristic of the target, such as the target size.

SUMMARY

The present invention relates to a sensor network comprising a plurality of sensor nodes communicatively coupled to a control hub. The sensor network uses a distributed sigma-delta converter to provide sensor measurement data from the sensor nodes to the control hub. The sensor nodes include a sample circuit, a sigma-delta modulator, and communication circuit. Each sensor node oversamples a sensed input signal using the sample circuit, generates a serial bit stream from the oversampled input signal using the sigma-delta modulator, and transmits the serial bit stream to the remote sigma-delta processor using the communication circuit. By transmitting a digital representation of the sensor input signal to a corresponding sigma-delta processor in the remote control hub, the sensor nodes provide the actual data collected by the sensor nodes to the control hub.

The control hub includes a sigma-delta processor for each sensor node and a controller. Each sigma-delta processor digitally processes a serial bit stream received from a corresponding sensor node to generate a digital output signal that represents the data collected by the sensor node. The controller analyzes the output from each sigma-delta processor to determine one or more characteristics of the environment of the sensor network.

The methods and apparatuses described herein include a distributed sigma-delta converter comprising a sigma-delta modulator remotely located from a sigma-delta processor. The distributed sigma-delta converter may have other applications besides the sensor network described herein, where the sigma-delta modulator generates a serial bit stream based on an oversampled input signal and transmits the serial bit stream to a remotely located sigma-delta processor. The sigma-delta processor filters and decimates the received serial bit stream to determine a digital value corresponding to the modulator input signal.

DETAILED DESCRIPTION

Figure 1:
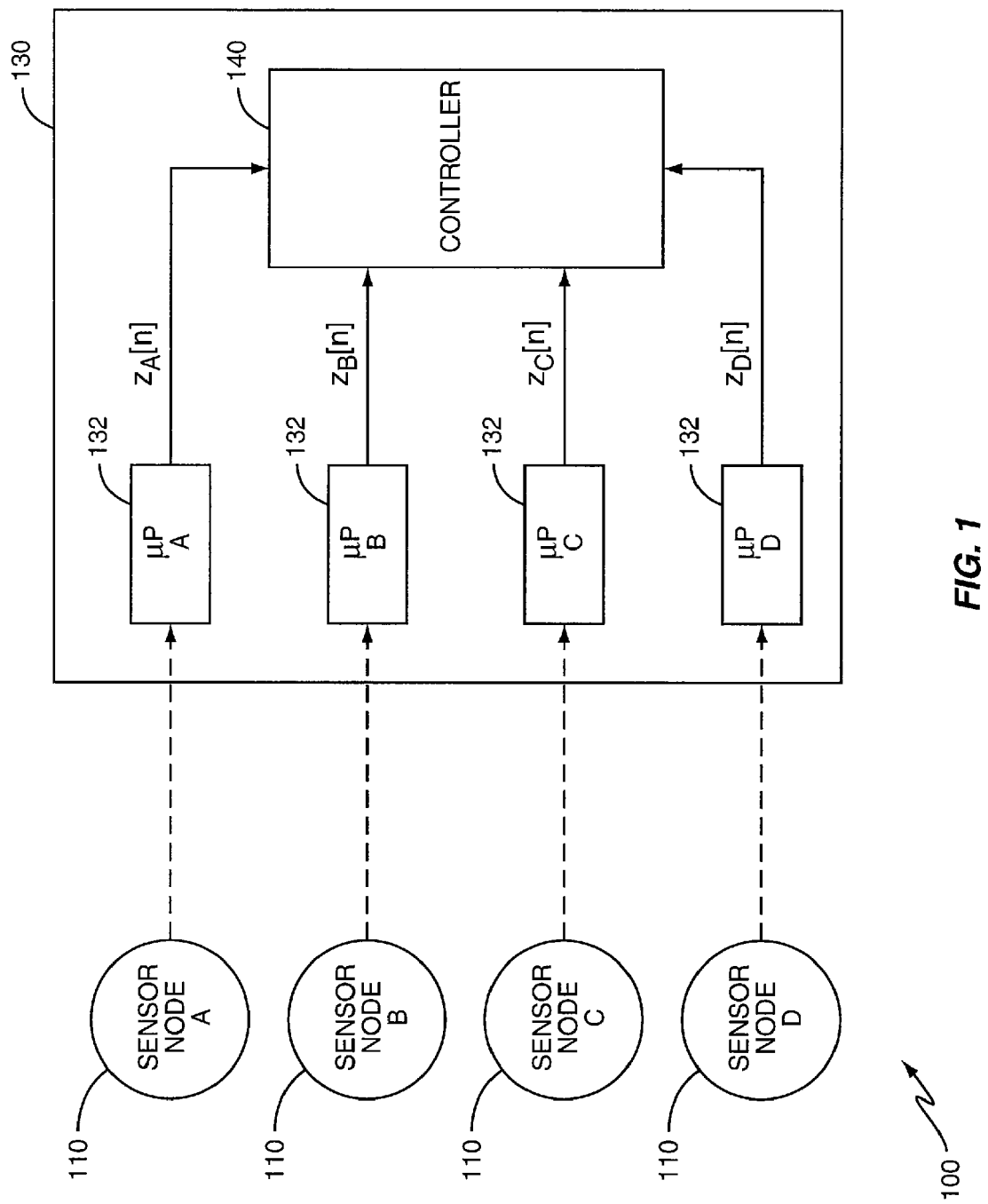
FIG. 1 shows a block diagram of one exemplary sensor network.

FIG. 1 shows one exemplary sensor network 100 comprising four sensor nodes 110 communicatively coupled to a control hub 130. It will be appreciated that sensor network 100 may include any number of sensor nodes 110 distributed over a predetermined area of the sensor network environment. Each sensor node 110 comprises a battery powered device that generates a serial bit stream representative of a sensor output signal. The control hub 130 includes a plurality of signal processors 132, each of which receive and digitally process the serial bit stream transmitted by a corresponding sensor node 110. Subsequently, a controller 140 analyzes the digital output from each signal processor 132 to determine one or more network characteristics. Exemplary characteristics include but are not limited to sound, temperature, humidity, wind, pressure, vibration, chemicals, light, motion, etc. In one exemplary embodiment, the controller 140 may analyze the output signals to detect and/or track a target moving through network 100.

The following describes the sensor network 100 in terms of a distributed sigma-delta converter. It will be appreciated that the distributed sigma-delta converter described herein may be used in other networks besides sensor network 100. As such, the distributed sigma-delta converter described herein may be used in any network having an analog node remotely located from a digital signal processor, where the analog node generates a serial bit stream representative of an analog input signal, and where the remote signal processor completes the sigma-delta conversion by digitally processing the serial bit stream received from the analog node over a wireless communication link.

Figure 2:
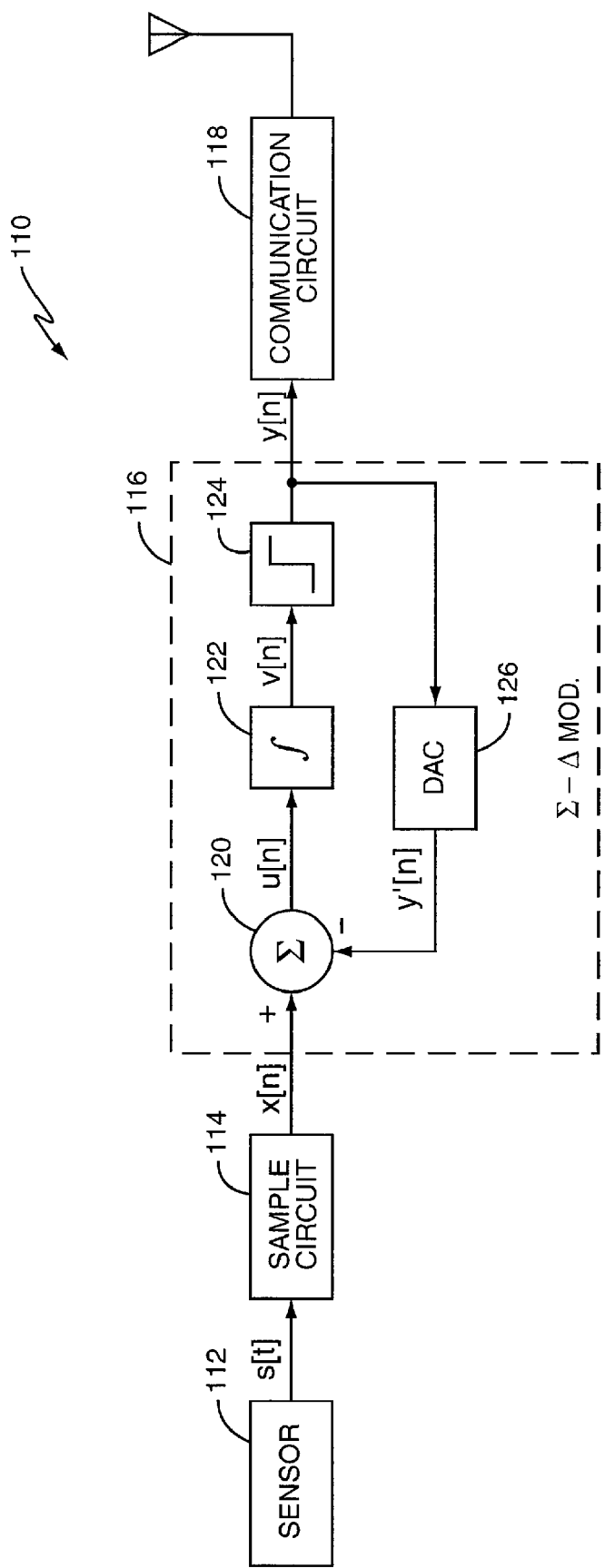
FIG. 2 shows a block diagram of one exemplary sensor node in one exemplary sensor network.

FIG. 2 shows a block diagram of one exemplary sensor node 110 in sensor network 100. Each sensor node 110 includes a sensor 112, sample circuit 114, sigma-delta modulator 116, and communication circuit 118. Sensor 112 comprises any known sensor that senses a desired characteristic of its environment to provide an input signal s(t) representative of the sensed characteristic to the sample circuit 114. Exemplary sensors include but are not limited to motion sensors, audio sensors (e.g., microphones), temperature sensors (e.g., thermometers), humidity sensors, wind sensors, pressure sensors, vibration sensors, chemical sensors, light sensors (e.g., photodetectors) etc. Sample circuit 114 oversamples the input signal s(t) at a predetermined sample rate to generate an oversampled input signal x[n]. For example, sample circuit 114 may sample the input signal s(t) at a sample rate 60 times the Nyquist frequency of the input signals s(t). Sigma-delta modulator 116 generates a serial bit stream comprising a plurality of bits y[n] based on the oversampled input signal x[n]. Communication circuit 118 transmits each bit y[n] of the serial bit stream generated by the sigma-delta modulator 116 to the corresponding sigma-delta processor 132 in control hub 130 according to any known means. It will be appreciated that the communication circuit 118 in each sensor node 110 may use any known means to distinguish its transmitted bit stream from the transmitted bit streams of the other sensor nodes 110. For example, the communication circuits 118 in different sensor nodes 110 may use different frequencies, time slots, spreading codes, etc., to transmit the bit streams.

One exemplary sigma-delta modulator 116 includes a summing node 120, integrator 122, quantizer 124, and digital-to-analog converter 126. The summing node 120 generates an error signal u[n] based on the difference between the oversampled input signal x[n] and a feedback signal y'[n]. Integrator 122 accumulates the error signal u[n] to generate an integrated error signal v[n]. Quantizer 124 outputs a single-bit y[n], e.g., a 1 or a 0, indicative of whether or not the integrated error signal v[n] is above or below a threshold. It will be appreciated that quantizer 124 may comprise any known quantizer, and may be implemented using a comparator. The digital-to-analog converter 126 generates the feedback signal y'[n] by converting each bit y[n] of the serial bit stream to a discrete analog value.

It will be appreciated that the sensor nodes 110 described herein may use sigma-delta modulators other than the one described above and shown in FIG. 2. Further, while the above describes the sigma-delta modulator 116 as a first order sigma-delta modulator that generates one bit y[n] for each input sample value x[n], it will be appreciated that sigma-delta modulator 116 may comprise an $M^{th}$-order sigma-delta modulator that generates M-bits for each input sample value x[n]. Because multi-order sigma-delta modulators are well known, such modulators will not be discussed further herein.

Figure 3:
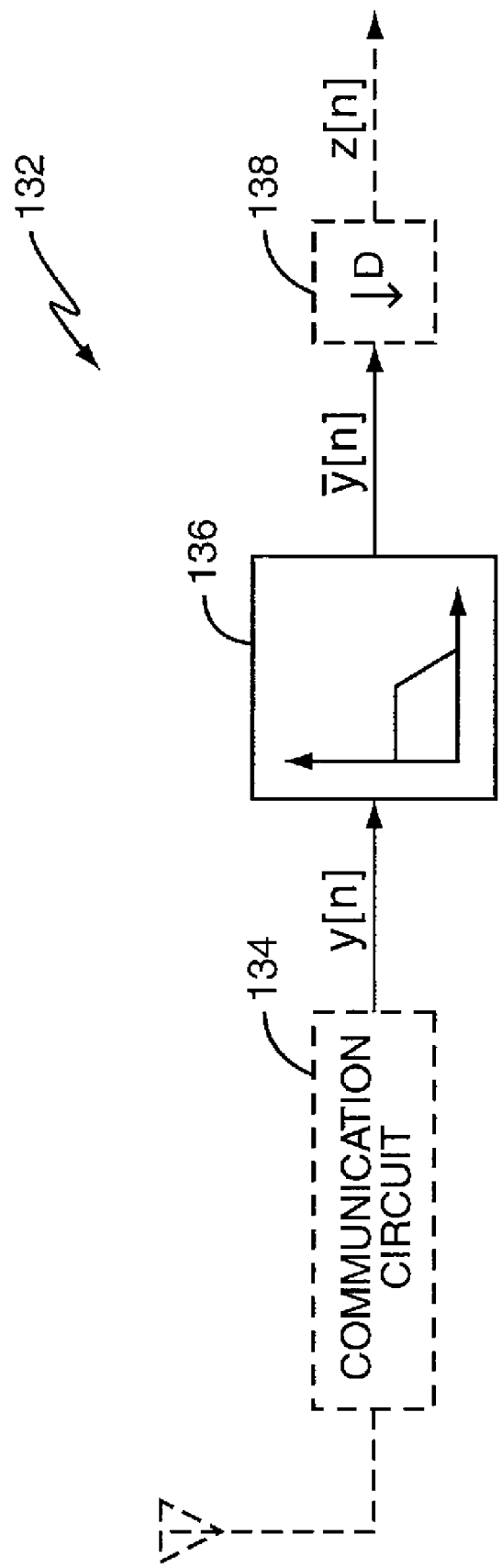
FIG. 3 shows a block diagram of one exemplary sigma-delta processor in one exemplar sensor network.

Each serial bit stream transmitted by a sensor node 110 is received and processed by a corresponding signal processor 132 in the control hub 130. As described further below, signal processor 132 represents a sigma-delta processor that completes the sigma-delta conversion of the oversampled input signal x[n]. FIG. 3 shows one exemplary sigma-delta processor 132 that includes a communication circuit 134, low-pass filter 136, and decimator 138. Communication circuit 134 receives the serial bit stream from the corresponding sensor node 110. Filter 136 comprises any low-pass filter that filters the received bit stream to generate ȳ[n] representative of the low frequency content of the oversampled input signal x[n]. Decimator 138 down-samples the filtered bit stream ȳ[n] at a predetermined rate related to the oversampling rate of the sample circuit 114 to generate an output signal z[n]. For example, if the sample rate of sample circuit 114 is 60 times the Nyquist frequency, decimator 138 may select every $60^{th}$ bit of the filtered bit stream ȳ[n] to generate z[n].

Figure 4:
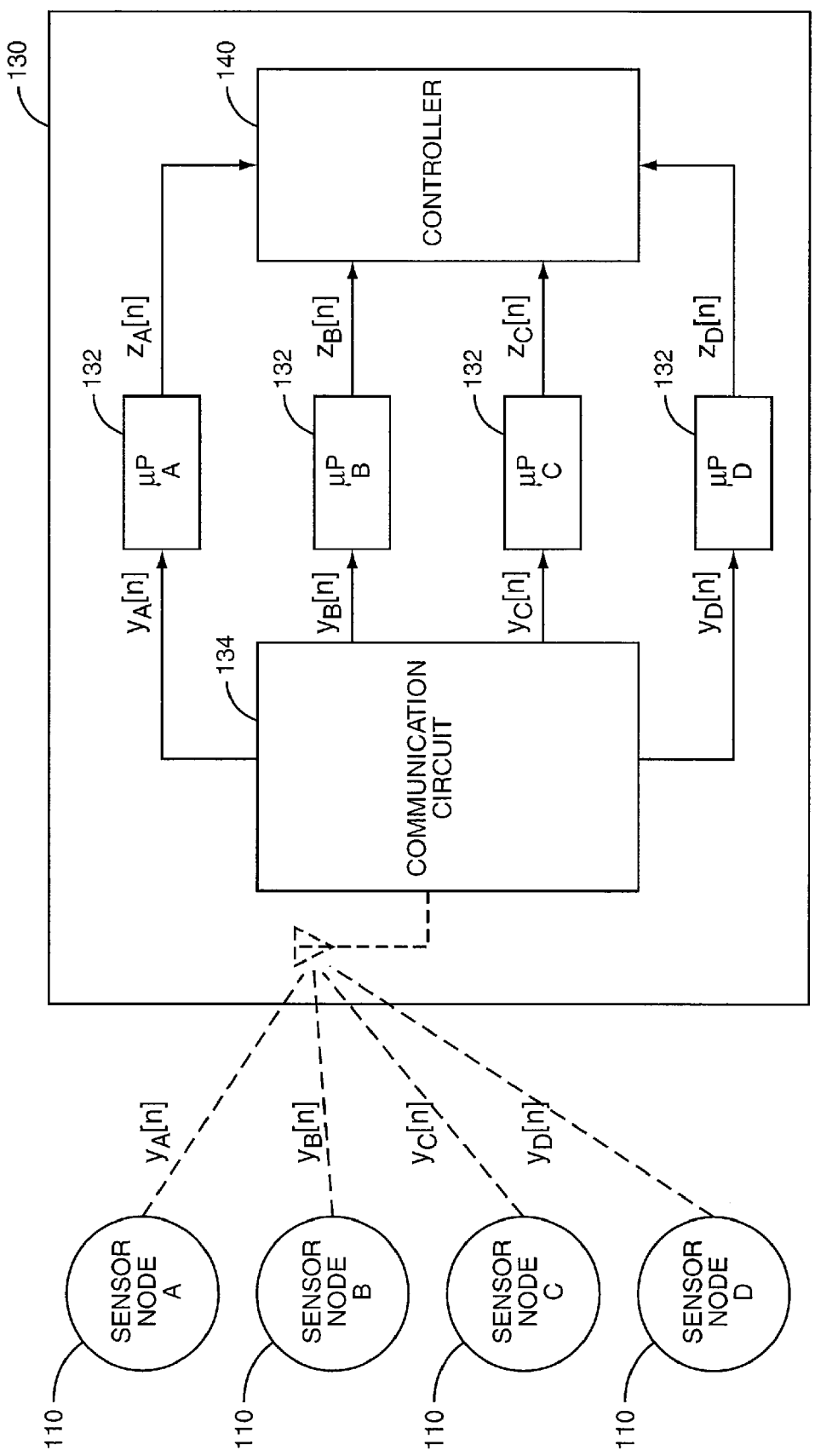
FIG. 4 shows a block diagram of another exemplary sensor network.

While FIG. 3 shows a separate filter 136 and decimator 138, those skilled in the art will appreciate that the filtering and decimation operations may be implemented by a single decimation filter 136. A Finite Impulse Response (FIR) filter represents one exemplary type of decimation filter. Further, while FIG. 3 shows that each sigma-delta processor 132 includes a communication circuit 134, it will be appreciated that the control hub 130 may alternatively include one or more communication circuits 134 external to the sigma-delta processor 132, as shown in FIG. 4. In this case, the communication circuit 134 routes the received bit streams to the appropriate sigma-delta processors 132. For example, communication circuit 134 would route the bit stream from sensor node A to sigma-delta processor A. Subsequently, sigma-delta processor A filters and decimates $y_A[n]$ to generate the output signals $z_A[n]$.

The output signal z[n] of each sigma-delta processor 132 is a digital representation of the input signal s(t) of the corresponding sensor node 110, and therefore is a digital representation of the data collected by a sensor 112. Because the output signal z[n] provided to controller 140 represents the data collected by a sensor 112, as opposed to hard decisions made by the sensor node 110, the controller 140 may determine a wide variety of environmental characteristics associated with the sensor network 100 by analyzing the output signals z[n]. For example, if sensor 112 comprises a microphone, the controller 140 may analyze the audio data collected by the sensor node 110 to determine the presence, location, and amplitude of sound in the network 100. This information may be used to not only to detect the presence of a target, but also to track the target.

Figure 5:
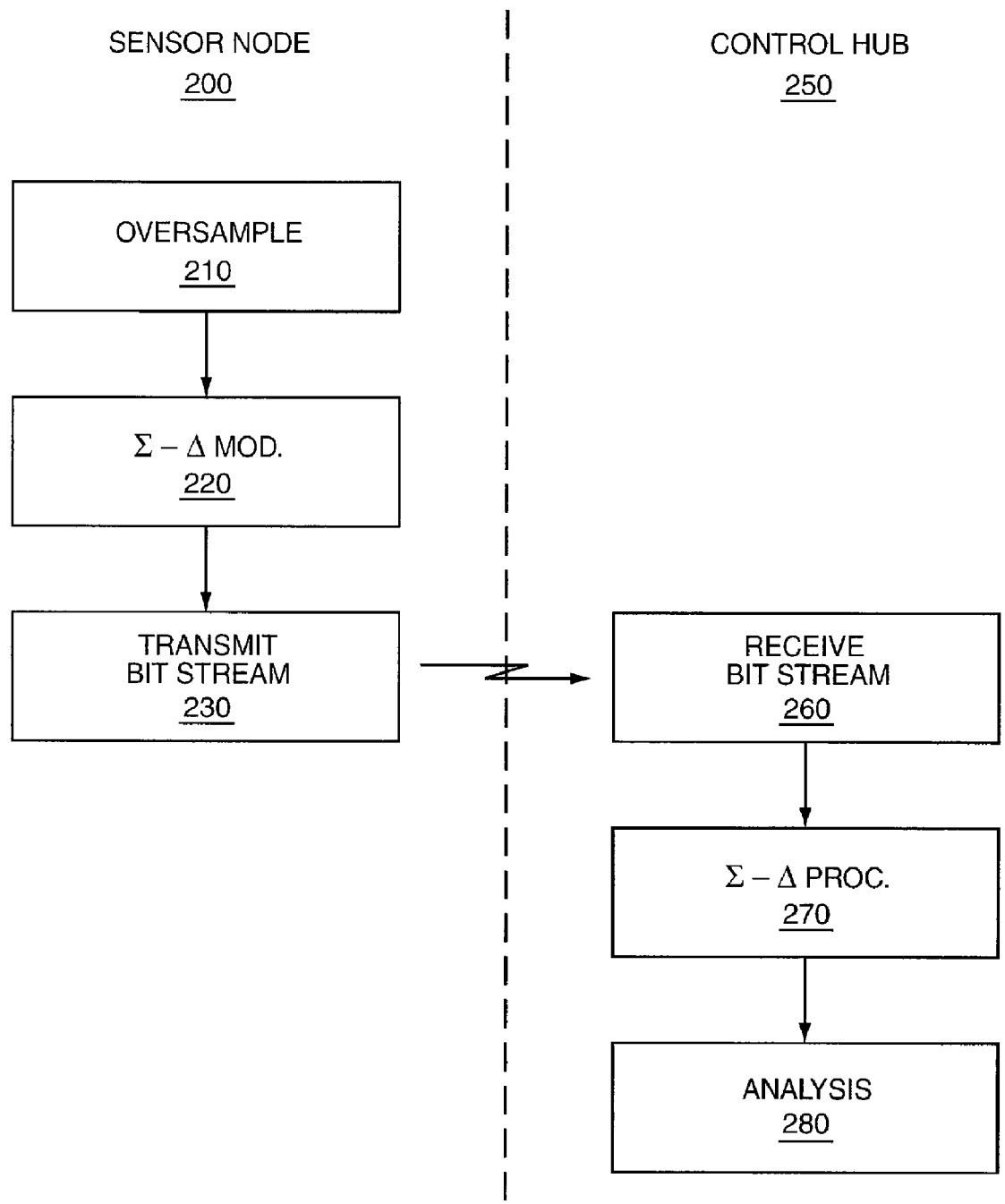
FIG. 5 shows process diagrams for one exemplary sensor network.

FIG. 5 broadly illustrates the process steps 200, 250 implemented by the sensor nodes 110 and control hub 130 of one exemplary sensor network 100. At the sensor node 110, the sample circuit 114 oversamples the sensed input signal at a predetermined sample rate (block 210). The sigma-delta modulator 116 generates a serial bit stream based on the oversampled input signal (block 220). Communication circuit 118 transmits the serial bit stream to the corresponding sigma-delta processor 132 at the control hub (block 230). After receiving a bit stream from a corresponding sensor node 110 (block 260), the sigma-delta processor 132 processes the bit stream to generate a digital output signal representative of the sensor output signal (block 270). The controller 140 analyzes the output signals from each sigma-delta processor 132 to determine one or more environmental characteristics of the sensor network 100.

The above describes a method and apparatus that distributes the sigma-delta conversion operations within a sensor network 100 by performing sigma-delta modulation at the sensor nodes 110 and performing sigma-delta digital processing at the control hub 130. As a result, a single type of sensor node 110 may be used for a wide variety of different processing operations. For example, the same sensor nodes 110 may be used with different controllers 140 and/or different versions of the software executed by controller 140. This further enables the signal processing software to be easily upgraded at a central location, i.e., the control hub, and eliminates the need to upgrade each sensor node 110 every time the sigma-delta processor 132 or controller 140 software changes. This flexibility may result in significant cost savings.

In addition, because all power-intensive signal processing operations are implemented at the control hub 130, which has an unlimited power supply, instead of at the sensor nodes 110, which have limited power supplies, the distributed sigma-delta technique described herein may reduce the power requirements of the sensor nodes 110. This in turn, may extend the battery life, and therefore, the overall life of the sensor nodes 110.

It will be appreciated that control hub 130 may further extend the battery life of the sensor nodes 110 by controlling when and how often the sensor nodes 110 are active. For example, when the temperature at an orange grove is above 35° F., the sensor nodes 110 may collect data and transmit a corresponding serial bit stream for the first minute of every hour. However, when the temperature drops below 35° F., the controller 140 may send a control signal to the sensor nodes 110 via communication circuits 118, 134 to direct the sensor nodes 110 to collect data and transmit the corresponding serial bit streams every five minutes. It will further be appreciated that the controller 140 may set different transmission intervals for different sensor nodes 110.

The distributed sigma-delta converter described herein may have applications other than the sensor network application described above. Thus, the present invention may be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A plurality of sensor nodes for a sensor network, each sensor node comprising:
   a sensor configured to sense at least one characteristic of the environment of said sensor network;
   a sampling circuit configured to oversample an input signal at a predetermined sample rate;
   a sigma-delta modulator configured to generate a serial bit stream based on the oversampled input signal; and
   a communication circuit to transmit said serial bit stream to a corresponding sigma-delta processor in a remote control hub comprising a sigma-delta processor for each sensor node.

2. The sensor node of claim 1 wherein the sigma-delta modulator comprises:
   a summing node to generate an error signal based on the input signal and a feedback signal;
   an integrator to generate an integrated signal based on the error signal; and
   a quantizer configured to quantize the integrated signal to generate the serial bit stream.

3. The sensor node or claim 2 further comprising a digital-to-analog converter to convert said serial bit stream into analog form to generate said feedback signal.

4. The sensor node of claim 1 wherein the sigma-delta modulator comprises a first order sigma-delta modulator.

5. The sensor node of claim 1 wherein the sensor comprises one of a motion sensor, audio sensor, temperature sensor, humidity sensor, wind sensor, pressure sensor, vibration sensor, chemical sensor, and light sensor.

6. The sensor node of claim 1 wherein each sensor in the sensor network is configured to sense a different environmental characteristic.

7. A method of providing digital data from a plurality of sensor nodes to a remote control hub comprising a sigma-delta processor for each sensor node, the method comprising:
   oversampling a sensor node input signal at each sensor node at a predetermined sample rate to generate an oversampled signal;
   performing sigma-delta modulation on the oversampled input signal in each sensor node to generate a serial bit stream for each sensor node; and
   transmitting each serial bit stream to the corresponding sigma-delta processor in the remote control hub.

8. The method of claim 7 wherein performing sigma-delta operations comprises:
   generating an error signal based on the input signal and a feedback signal;
   generating an integrated signal based on the error signal; and
   quantizing the integrated signal to generate the serial bit stream.

9. A control hub communicatively coupled to a plurality of sensor nodes in a sensor network, said control hub comprising:
   a plurality of sigma-delta processors, each of said sigma-delta processors corresponding to a sigma-delta modulator in one of the sensor nodes and configured to generate an output signal based on a serial bit stream received from a corresponding sensor node; and
   a controller configured to analyze the output signals from each sigma-delta processor to determine one or more characteristics of the environment of said sensor network.

10. The control hub of claim 9 wherein each sigma-delta processor comprises a filter configured to:
    lowpass filter the serial bit stream received from the corresponding sensor node; and
    decimate the filtered bit stream to generate the output signal.

11. The control hub of claim 9 wherein each sigma-delta processor comprises:
    a filter configured to lowpass filter the serial bit stream received from the corresponding sensor node; and
    a decimator configured to decimate the filtered bit stream to generate the output signal.

12. The control hub of claim 9 wherein each sigma-delta processor further comprises a communication circuit to receive the serial bit stream from the corresponding sensor node.

13. The control hub of claim 9 further comprising one or more communication circuits configured to receive the serial bit streams from each sensor node and to provide each bit stream to the corresponding sigma-delta processor.

14. A method of digitally processing digital data provided by a plurality of sensor nodes in a sensor network, the method comprising:
    receiving a plurality of serial bit streams from corresponding sensor nodes in the sensor network;
    performing separate sigma-delta processing operations on each of said received serial bit streams to generate an output signal; and
    analyzing the output signals to determine one or more characteristics of the environment of the sensor network.

15. The method of claim 14 wherein performing separate sigma-delta processing comprises:
    filtering the serial bit stream received from a corresponding sensor node; and
    decimating the filtered bit stream to generate the output signal.

16. A sensor network comprising:
    a plurality of sensor nodes, wherein each sensor node comprises a sigma-delta modulator configured to generate a serial bit stream based on an oversampled sensor input signal; and
    a control hub communicatively coupled to the plurality of sensor nodes and comprising a plurality of sigma-delta processors, wherein each sigma-delta processor corresponds to a different sensor node and is configured to generate an output signal based on the serial bit streams received from a corresponding sensor node.

17. The sensor network of claim 16 wherein each of said sensor nodes further comprises:
    a sampling circuit configured to oversample the input signal at a predetermined sample rate to generate the oversampled input signal; and a communication circuit to transmit said serial bit stream to the corresponding sigma-delta processor in the control hub.

18. The sensor network of claim 16 wherein the control hub further comprises a controller configured to analyze the output signals from each sigma-delta processor to determine one or more characteristics of the environment of said sensor network.

19. A method of processing signals in a sensor network comprising a plurality of sensor nodes communicatively coupled to a control hub comprising a plurality of sigma-delta processors, the method comprising:

performing sigma-delta modulation on oversampled input signals to generate a serial bit stream at each sensor node;

transmitting each serial bit stream to a corresponding sigma-delta processor in the control hub;

performing separate sigma-delta processing operations on each serial bit stream received at the control hub to generate an output signal corresponding to each sensor node; and analyzing the output signals to determine one or more characteristics of the environment of the sensor network.

20. The method of claim 19 wherein each sensor node is configured to sense a different environmental characteristic.

* * * * *